(12) United States Patent
Chiang et al.

(10) Patent No.: US 10,871,262 B2
(45) Date of Patent: Dec. 22, 2020

(54) STRUCTURED LIGHT ILLUMINATION MODULE

(71) Applicant: Spring Rainbow Optics Co., LTD, Taoyuan (TW)

(72) Inventors: Po-Liang Chiang, Taipei (TW); Yu-Teng Jheng, Changhua County (TW)

(73) Assignee: SPRING RAINBOW OPTICS CO., LTD, Taoyuan (TW)

( * ) Notice: Subject to any disclaimer, the term of this patent is extended or adjusted under 35 U.S.C. 154(b) by 150 days.

(21) Appl. No.: 16/173,009

(22) Filed: Oct. 29, 2018

(65) Prior Publication Data

US 2019/0128485 A1  May 2, 2019

Related U.S. Application Data

(60) Provisional application No. 62/580,487, filed on Nov. 2, 2017.

(51) Int. Cl.
*F21V 7/00* (2006.01)
*F21K 9/68* (2016.01)
*G02B 27/30* (2006.01)
*F21V 7/10* (2006.01)
*F21V 7/04* (2006.01)
*G02B 27/10* (2006.01)
*G02B 27/09* (2006.01)

(52) U.S. Cl.
CPC .............. *F21K 9/68* (2016.08); *F21V 7/0025* (2013.01); *F21V 7/0091* (2013.01); *F21V 7/04* (2013.01); *F21V 7/10* (2013.01); *G02B 27/0944* (2013.01); *G02B 27/1093* (2013.01); *G02B 27/30* (2013.01)

(58) Field of Classification Search
CPC ........ F21V 7/0091; F21V 7/0025; F21V 7/04; F21V 7/10; F21K 9/68; G02B 27/1093; G02B 27/20; G02B 27/30; G02B 27/42; G02B 27/4233; G03B 21/00; H01S 5/005
See application file for complete search history.

(56) References Cited

U.S. PATENT DOCUMENTS

| | | | |
|---|---|---|---|
| 2009/0109687 A1* | 4/2009 | Householder | F21V 5/006 362/309 |
| 2015/0049239 A1* | 2/2015 | Schneider | F21V 5/004 362/311.01 |
| 2016/0025993 A1* | 1/2016 | Mor | F21V 5/048 362/259 |

* cited by examiner

*Primary Examiner* — Y M. Quach Lee
(74) *Attorney, Agent, or Firm* — WPAT, PC

(57) ABSTRACT

A structured light illumination module is provided and includes a light source including a laser diode and configured for emitting light; an optical element including a light transmissive part which receives light and allows collimated light to pass, and a total internal reflection part, wherein an angle θ between a reflective surface of the total internal reflection part and an optical axis of the optical element is configured for totally internally reflecting a part of the light by the reflective surface; a diffractive component configured for converting the light into a structured light pattern; and an energy recycling mechanism disposed on at least a part of an incident surface or an emergent surface of the optical element.

13 Claims, 4 Drawing Sheets

STRUCTURED LIGHT ILLUMINATION MODULE

CROSS REFERENCE TO RELATED APPLICATIONS

The present application claims the benefit of priority under 35 USC 119(e) of U.S. Provisional Patent Application No. 62/580,487 entitled "STRUCTURED LIGHT ILLUMINATION MODULE" and filed on Nov. 2, 2017, the contents of which are incorporated herein by reference in their entirety.

FIELD OF THE INVENTION

The present disclosure relates to the technical field of structured light illumination, and particularly to a structured light illumination module with improved light energy utilization.

BACKGROUND OF DISCLOSURE

Generally, a portable device (such as a mobile phone), a camera or an industrial or security camera requires a structured light illumination module to achieve a three-dimensional sensing function. An innovative design is needed for the illumination module to optimize the light source utilization. Therefore, it is necessary to develop a structured light illumination module with improved light energy utilization.

SUMMARY OF INVENTION

A primary object of the present disclosure is to provide a structured light illumination module for improving light energy utilization.

A structured light illumination module is provided in an aspect of the present disclosure, and includes:

a light source including a laser diode and configured for emitting light;

an optical element including a light transmissive part which receives the light emitted from the light source and allows collimated light emitted from the light source to pass, and a total internal reflection part, wherein an angle $\theta$ between a reflective surface of the total internal reflection part and an optical axis of the optical element is configured for totally internally reflecting at least a part of the light emitted from the light source by the reflective surface of the total internal reflection;

a diffractive component configured for converting the light emitted from the optical element into a structured light pattern; and an energy recycling mechanism disposed on at least a part of an incident surface of the optical element or at least a part of an emergent surface of the optical element.

In accordance with another embodiment of the present disclosure, the angle $\theta$ ranges from 7 degree to −18 degree.

In accordance with an embodiment of the present disclosure, a part of the light emitted from the light source with a divergence angle being greater than 0 degree and less than or equivalent with 9 degree is totally internally reflected back multiple times by the reflective surface of the total internal reflection part inside the optical element for homogenizing the light emitted from the light source.

In accordance with an embodiment of the present disclosure, the optical element is made from plastic material with a refractive index of about 1.5.

In accordance with another embodiment of the present disclosure, the structured light illumination module further includes a lens assembly disposed between the optical element and the diffractive component, and configured to adjust the light passing through the light transmissive part of the optical element for the diffractive component.

In accordance with an embodiment of the present disclosure, the incident surface and the emergent surface include a spherical surface, an aspherical surface, a Fresnel surface, or a freeform curved surface.

In accordance with an embodiment of the present disclosure, an area of the energy recycling mechanism ranges from 0% to 90% of an area of the incident surface of the optical element.

In accordance with an embodiment of the present disclosure, the optical element is shaped as a truncated cone, a truncated quadrangular cone, or a cylinder.

In accordance with an embodiment of the present disclosure, the emergent surface of the optical element includes a collimator or a part of a collimation system.

In accordance with an embodiment of the present disclosure, a part of the light source includes a reflective surface configured for reflecting light, which exits from the optical element through the light transmissive part, back into the optical element.

In accordance with an embodiment of the present disclosure, an area of the incident surface of the optical element is larger or smaller than an area of the emergent surface of the optical element.

A structured light illumination module is provided in an aspect of the present disclosure, and includes:

a light source configured for emitting light;

an truncated conical optical element including an incident surface, an emergent surface, and a lateral surface, wherein each of the incident surface and the emergent surface has a light transmissive zone which receives the light emitted from the light source and allows collimated light emitted from the light source to pass, and an angle $\theta$ between the lateral surface and an optical axis of the optical element is configured for totally internally reflecting at least a part of the light emitted from the light source by the lateral surface;

a diffractive component configured for converting the light emitted from the optical element into a structured light pattern; and an energy recycling mechanism disposed on at least a part of the incident surface of the optical element or at least a part of the emergent surface of the optical element.

In accordance with an embodiment of the present disclosure, the angle $\theta$ ranges from 7 degree to −18 degree.

In accordance with an embodiment of the present disclosure, the part of the light emitted from the light source with a divergence angle being greater than 0 degree and less than or equivalent with 9 degree is reflected back multiple times by the lateral surface inside the optical element for homogenizing the light emitted from the light source.

In accordance with an embodiment of the present disclosure, the optical element is made from plastic material with a refractive index of about 1.5.

In accordance with an embodiment of the present disclosure, the structured light illumination module further includes a lens assembly disposed between the optical element and the diffractive component, and configured to adjust the light passing through the light transmissive zone of the optical element for the diffractive component.

In accordance with an embodiment of the present disclosure, the light source includes a laser diode.

In accordance with an embodiment of the present disclosure, the incident surface and the emergent surface include a spherical surface, an aspherical surface, a Fresnel surface, or a freeform curved surface.

In accordance with an embodiment of the present disclosure, an area of the energy recycling mechanism ranges from 0% to 90% of an area of the incident surface of the optical element.

In accordance with an embodiment of the present disclosure, the emergent surface of the optical element includes a collimator or a part of a collimation system.

In accordance with an embodiment of the present disclosure, a part of the light source includes a reflective surface configured for reflecting light, which exits from the optical element through the light transmissive zone, back into the optical element.

In accordance with an embodiment of the present disclosure, an area of the incident surface of the optical element is larger or smaller than an area of the emergent surface of the optical element.

In the structured light illumination module in accordance with the present disclosure, the part of the light emitted from the light source with a divergence angle being greater than 0 degree and less than or equivalent with 9 degree is totally internally reflected back by the reflective surface of the total internal reflection part (or by the lateral surface of the optical element), in some cases, is reflected back multiple times inside the optical element for homogenizing the light emitted from the light source, and then exits from the optical element through the light transmissive part for collimating the light emitted from the light source, and increasing light output of the structured light illumination module. Moreover, the energy recycling mechanism disposed on at least a part of the incident surface of the optical element or at least a part of the emergent surface of the optical element for reflecting the part of the light which is emitted from the light source onto the incident surface or the emergent surface, but doe not exit from the optical element through the light transmissive part. In the combination of the reflective surface of the total internal reflection part (or the lateral surface of the optical element) and the energy recycling mechanism, the light emitted from the light source may be reflected by the energy recycling mechanism first, and then reflected by the reflective surface of the total internal reflection part (or the lateral surface of the optical element), or may be reflected by the reflective surface of the total internal reflection part (or the lateral surface of the optical element), and then reflected by the energy recycling mechanism, thereby achieving the synergetic effect and drastically improving the light energy utilization.

BRIEF DESCRIPTION OF DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
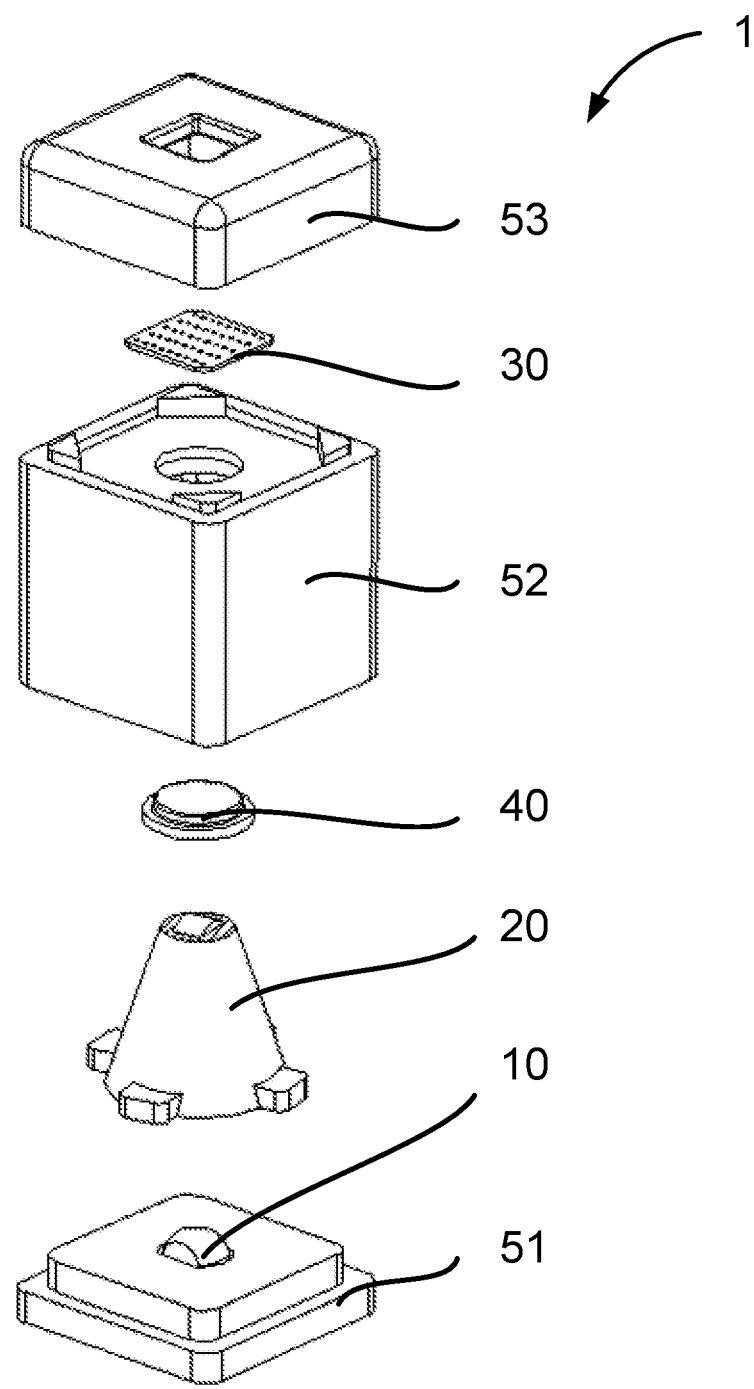
FIG. 1 is an exploded view illustrating a structured light illumination module in accordance with an embodiment of the present disclosure.

The following description of the embodiments with reference to the accompanying drawings is used to illustrate particular embodiments of the present disclosure. The directional terms used in the present disclosure, such as "upper", "lower", "front", "back", "left", "right", "inner", "outer", "side surface", etc., are only directions with regard to the accompanying drawings. Therefore, the directional terms used for describing and illustrating the present disclosure are not intended to limit the present disclosure.

In the drawings, units with similar structures are indicated by the same reference number.

As to an "embodiment" mentioned herein, the particular features, structures, or characteristics described in this embodiment, which may be described in combination with the embodiment, may be included in at least one embodiment of the present disclosure. The phrases appearing at various locations in the specification do not necessarily refer to the same embodiments, nor to the embodiments being alternative to, mutually exclusive with, or independent from other embodiments. It is explicitly and implicitly understood by a person of ordinary skill in the art that the embodiments described herein may be combined with other embodiments.

The content of the present disclosure is described in detail by reference to embodiments below in conjunction with the accompanying drawings.

By reference to the accompanying drawings, the technological content and embodiments of the present disclosure are described in detail as follows:

Refer to FIG. 1, which is an exploded view illustrating a structured light illumination module in accordance with an embodiment of the present disclosure.

In the present disclosure, a structured light illumination module 1 is provided, and includes a light source 10, an optical element 20, and a diffractive component 30. In an embodiment, the light source 10, the optical element 20, and the diffractive component 30 are contained in a housing including a bottom 51, a lateral wall 52 and an upper cover 53. The light resource is attached to the bottom 51. The components inside the housing, such as the light source 10, the optical element 20, and the diffractive component 30 are directly or indirectly supported by the bottom 51, surrounded by the lateral wall 52, and covered by the upper cover 53. An aperture or a window through which the light emitted from the light source 10 passes is defined in the upper cover 53. The structured light illumination module 1 may be assembled into a single compact module. The housing is not necessary, for example, depending upon the apparatus to which the structured light illumination module 1 is applied. In an embodiment, the structured light illumination module 1 may further includes a lens assembly 40 between the optical element 20, and the diffractive component 30, but the lens assembly 40 is optional based upon the design of the optical element 20.

The light source 10 includes a laser diode. Because the power of the laser diode is low, the optical element 30 may be made of plastic material, which makes the manufacturing process of the optical element cheaper, for example, compared with glass material, and improves the yield. In addition, the use of different plastic materials may affect the refractive index and the design of the optical element 30.

Since the laser diode is designed to generate infrared light having a divergence angle of about a certain angle (such as 9 degrees), the design of the optical element 30 may make infrared light be reflected inside the optical element 30 multiple times for achieving light homogenization based upon the total internal reflection principle. Moreover, light is collimated by the design of the surface which incident light enters and the design of the surface from which emergent light exits in the optical element 30. Furthermore, the optical element 30 may be designed to recycle light energy to increase light energy utilization efficiency.

The lens assembly 40 between the diffractive element 30 and the optical element 20 is intended to further adjust the light for optimal light collimation. For instance, the optical element 20 or the lens assembly 40 has optical surfaces with Fresnel characteristics, so that when the infrared light enters and passes through the diffractive element 30, a light pattern with a specific geometry is emitted, which is referred to as structured light. The complexity of the lens assembly 40 may be simplified (e.g. no more than two lenses) by integrating a part of the lens assembly 40 into the optical element 20. The diffractive component 30 is constructed by a matrix of diffractive sub-elements for converting the light emitted by the light source into the structured light pattern.

Figure 2:
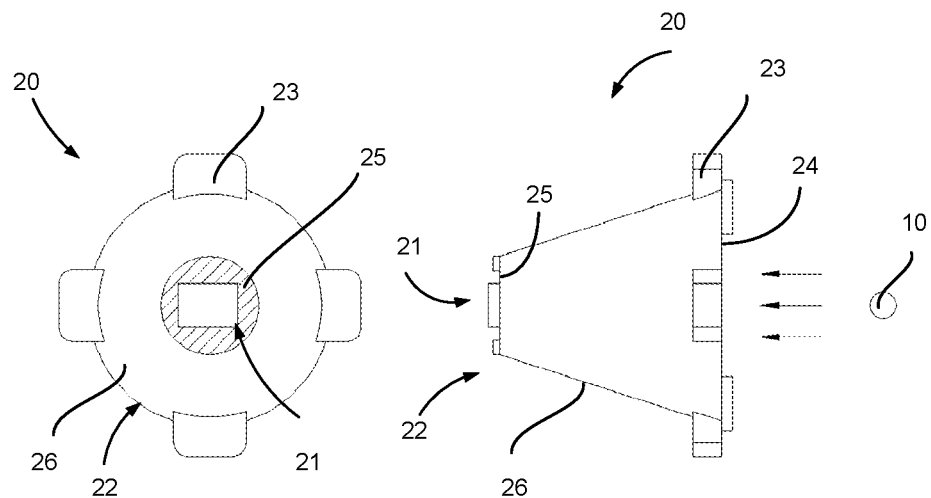
FIG. 2 shows a top view and a side view illustrating an optical element in a structured light illumination module in accordance with an embodiment of the present disclosure.

Refer to FIG. 2, which shows a side view and a top view illustrating an optical element in a structured light illumination module in accordance with an embodiment of the present disclosure.

As shown in FIG. 2, the optical element 20 may be divided into a light transmissive part 21, a reflective part 22, and a mounting part 23. The light transmissive part 21 is the physical part through which the light passes, the reflective part 22 is the physical part where the light is reflected, and the mounting part 23 is the physical part which involves the assembly of different components, and is not related to the optical effect.

Moreover, for the optical element 20, the surface close to the light source 10 is referred to as the incident surface 24, the surface facing away from the light source 10 is referred to as the emergent surface 25, and, moreover, the lateral surface 26 therebetween has a specific angle with respect to the optical axis for total internal reflection.

Furthermore, the geometry of the light transmissive part 21 may be circular, square, rectangular, or elliptical. In order to achieve the highest energy utilization efficiency and the best uniformity of the illumination zone, the light transmissive part 21 is not necessarily at the center of the emergent surface 25.

Figure 3:
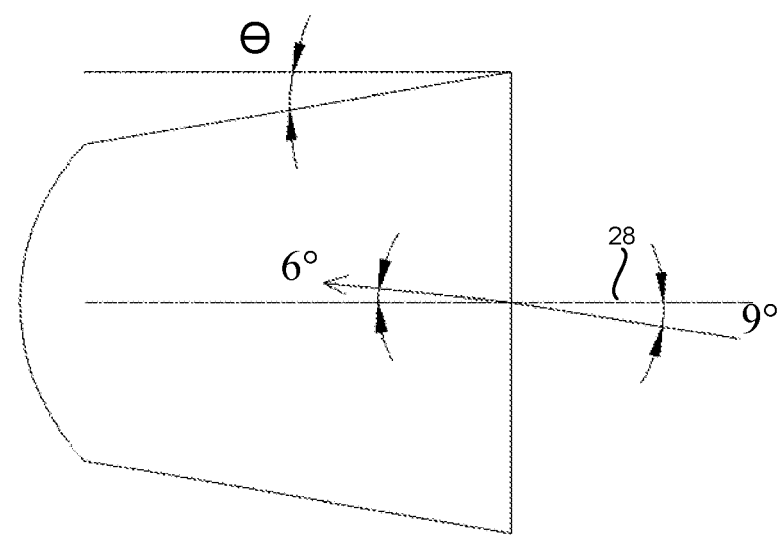
FIG. 3 is a side view illustrating a divergence angle of light emitted from a light source, and an angle θ between a lateral surface of an optical element and an optical axis of the optical element in accordance with an embodiment of the present disclosure.

Refer to FIG. 3, which is a side view illustrating a divergence angle of light emitted from a light source, and an angle θ between a lateral surface of an optical element and an optical axis of the optical element.

As shown in FIG. 3, the angle between the lateral surface 26 of the optical element 20 and the optical axis 28 is θ. In order to allow infrared light to be totally reflected back internally at least once or twice (in accordance with Snell's law) for optimizing light uniformity (if light is reflected multiple times inside the optical element 20, it is equivalent to the multiple virtual images of the light source 10 formed behind the reflecting lateral surface 26, thus producing the effect of illumination homogenization), the angle θ may be an oblique angle ranging from +7 degrees to −18 degrees with respect to the optical axis 28 in an embodiment. For example, it is assumed that the light source 10 emits a laser ray with a divergence angle of 9 degrees, and if the optical element 20 is made of plastic material having a refractive index of about 1.5, the divergence angle of the ray in the optical element 20 is about 6 degrees according to Snell's law (the refractive index of air is about 1). At this time, if the divergence angle of the ray inside the optical element 20 is greater than 6 degrees, or the divergence angle of the ray emitted from the light source 10 outside the optical element 20 is greater than 9 degrees, the ray irradiating the lateral surface 26 cannot cause the total internal reflection effect.

In an embodiment, the part of the light emitted from the light source 10 with a divergence angle being greater than 0 degree and less than or equivalent with 9 degree is totally internally reflected back multiple times by the lateral surface 26 inside the optical element 20 for homogenizing the light emitted from the light source 10, and exits from the optical element 20 through the light transmissive part 21 for collimating the light emitted from the light source 10 and increasing light output of the structured light illumination module 1.

In an embodiment, the emergent surface 25 of the optical element 20 may includes a collimating block, which may be a collimator or a part of a collimation system, and may be designed as a spherical surface, an aspherical surface, a Fresnel surface, or a freeform curved surface, for directing the homogenized light to an illuminated area. For example, the illuminated area may be the diffractive component 30 or the lens assembly 40.

In addition, similar to the concept of the emergent surface 25, the incident surface 24 may also be a plane, a spherical surface, an aspheric surface, a Fresnell surface, or a free curved surface. Furthermore, the other parts of the optical element 20 may be referred to as a homogenization block, as compared with the collimation block. Thus, the optical element 20 includes two functional blocks: the homogenization block and the collimation block.

Figure 4:
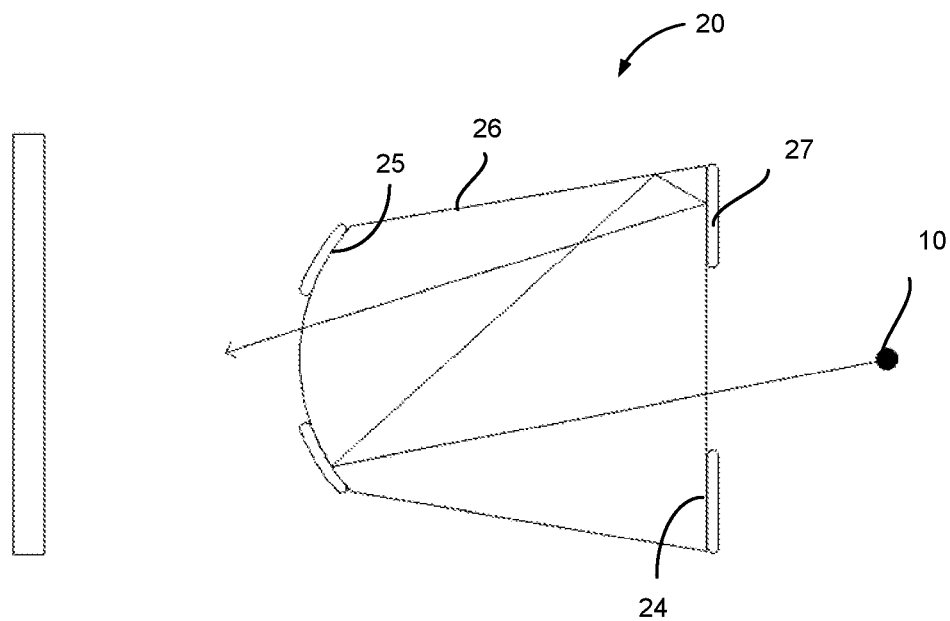
FIG. 4 is a side view illustrating an energy recycling mechanism disposed on an incident surface and an emergent surface of an optical element and the principle thereof for recycling light energy in accordance with an embodiment of the present disclosure.

Refer to FIG. 4, which is a side view illustrating an energy recycling mechanism disposed on an incident surface and an emergent surface of an optical element and the principle thereof for recycling light energy.

As shown in FIG. 4, the optical element 20 includes an energy recycling mechanism 27 for achieving more than one time of reflection. The energy recycling mechanism 27 on the emergent surface 25 is described as follows: Due to the limitation of the manufacturing process, it may not be possible that the geometry of the surface facing the illuminated area exactly matches the geometry of the illuminated area. In order to make the most efficient use of light energy, reflective surfaces are attached to the emergent surface 25, such that a part of the energy is reflected back into the optical element 20. The reflection function may be achieved by directly manufacturing an optical film on the optical element 20 or attaching a member having a reflective function to the emergent surface 25 of the optical element 20.

The energy recycling mechanism 27 at the incident surface 24 on described as follows: Due to the limitation of the manufacturing process, it may not be possible that the geometry of the surface facing the light source 10 exactly matches the geometry of the light source 10. In order to make the most efficient use of light energy, the reflective surfaces are attached to the incident surface 24, such that a part of the energy is reflected back into the optical element 20. The reflection function may be achieved by directly manufacturing an optical film on the optical element or attaching a member having a reflective function to the incident surface 24 of the optical element 20.

In addition, if the mounting part 23 is not taken into account, the reflective surface may occupy 0% to 90% of the area of the incident surface 24 of the optical element 10. Furthermore, at least part of the light source 10 itself has a bright surface with reflective capability, and some of light energy may also be reflected back into the optical element 20.

The light which cannot enter the illuminated area when exiting from the optical element 20 at the first time, via the reflection of the lateral surface 26 and the energy recovery mechanism 17, is likely to effectively reenter the illuminated area, thus achieving the recycling of the previously unusable light energy, and improving the overall efficiency.

Figure 5:
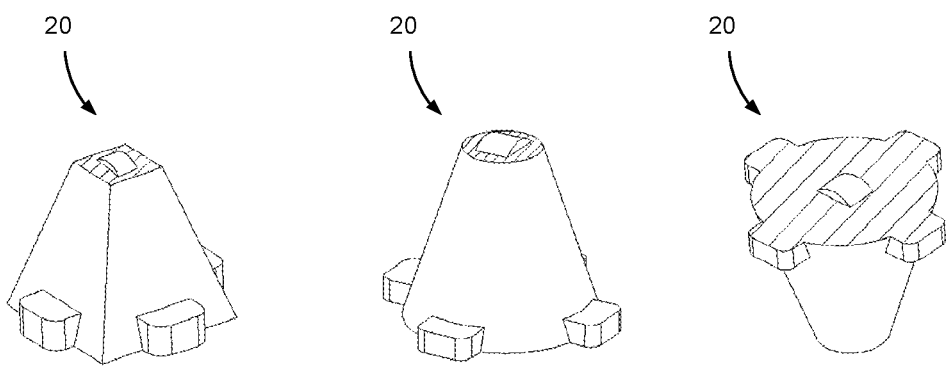
FIG. 5 shows schematic views of exemplary optical elements in accordance with other embodiments of the present disclosure.
Figure 6:
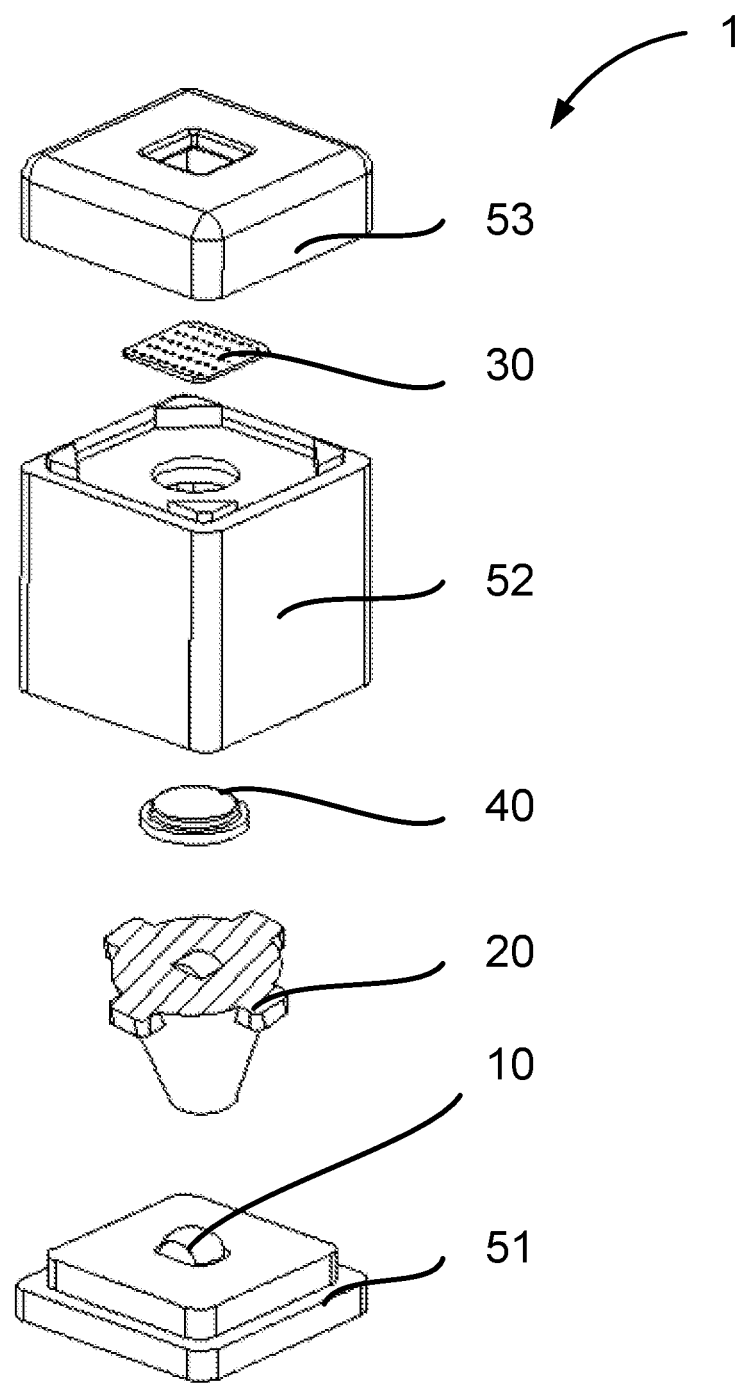
FIG. 6 is an exploded view illustrating a structured light illumination module in accordance with another embodiment of the present disclosure.

Refer to FIG. 5, which shows schematic views of exemplary optical elements in accordance with other embodiments of the present disclosure. Refer to FIG. 6, which is an exploded view illustrating a structured light illumination module in accordance with another embodiment of the present disclosure.

As shown in FIG. 5, the geometry of the optical component 20 may be as a truncated cone, a truncated quadrangular cone, or a cylinder. In addition, since the angle θ between the lateral surface 26 of the optical element 20 and the optical axis 27 may be a positive angle or a negative angle, the area of the incident surface 24 of the optical element 20 may be larger or smaller than the area of the emergent surface 25. Therefore, another aspect of the structured light illumination module 1 may be as shown in FIG. 6.

In the structured light illumination module in accordance with the present disclosure, the part of the light emitted from the light source with a divergence angle being greater than 0 degree and less than or equivalent with 9 degree is totally internally reflected back by the lateral surface of the optical element, in some cases, is reflected back multiple times inside the optical element for homogenizing the light emitted from the light source, and then exits from the optical element through the light transmissive part for collimating the light emitted from the light source, and increasing light output of the structured light illumination module. Moreover, the energy recycling mechanism disposed on at least a part of the incident surface of the optical element or at least a part of the emergent surface of the optical element for reflecting the part of the light which is emitted from the light source onto the incident surface or the emergent surface, but doe not exit from the optical element through the light transmissive part. In the combination of the lateral surface of the optical element and the energy recycling mechanism, the light emitted from the light source may be reflected by the energy recycling mechanism first, and then reflected by the lateral surface of the optical element, or may be reflected by the lateral surface of the optical element first, and then reflected by the energy recycling mechanism, thereby achieving the synergetic effect and drastically improving the light energy utilization.

The present disclosure has been described with a preferred embodiment thereof and it is understood that various modifications, without departing from the spirit of the present disclosure, are in accordance with the embodiments of the present disclosure. Hence, the embodiments described are intended to cover the modifications within the scope and the spirit of the present disclosure, rather than to limit the present disclosure.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A structured light illumination module for three dimension sensing, comprising:
    a light source including a laser diode and configured for emitting light;
    an optical element including a light transmissive part which receives the light emitted from the light source and allows collimated light emitted from the light source to pass, and a total internal reflection part, wherein an angle θ between a reflective surface of the total internal reflection part and an optical axis of the optical element is configured for totally internally reflecting at least a part of the light emitted from the light source by the reflective surface of the total internal reflection;
    a structured light diffractive component configured for converting the light emitted from the optical element into a structured light pattern, and spaced apart from the optical element; and
    an energy recycling mechanism disposed on at least a part of an incident surface of the optical element or at least a part of an emergent surface of the optical element.

2. The structured light illumination module as claimed in claim 1, wherein the angle θ ranges from 7 degree to −18 degree.

3. The structured light illumination module as claimed in claim 1, wherein a part of the light emitted from the light source with a divergence angle being greater than 0 degree and less than or equivalent with 9 degree is totally internally reflected back multiple times by the reflective surface of the total internal reflection part inside the optical element for homogenizing the light emitted from the light source.

4. The structured light illumination module as claimed in claim 1, wherein the optical element is made from plastic material with a refractive index of about 1.5.

5. The structured light illumination module as claimed in claim 1, further comprising a lens assembly disposed between the optical element and the diffractive component, and configured to adjust the light passing through the light transmissive part of the optical element for the diffractive component.

6. The structured light illumination module as claimed in claim 1, an area of the energy recycling mechanism ranges from 0% to 90% of an area of the incident surface of the optical element.

7. The structured light illumination module as claimed in claim 1, wherein the optical element is shaped as a truncated cone, a truncated quadrangular cone, or a cylinder.

8. A structured light illumination module for three dimension sensing, comprising:
    a light source including a laser diode and configured for emitting light;
    an truncated conical optical element including an incident surface, an emergent surface, and a lateral surface, wherein each of the incident surface and the emergent surface has a light transmissive zone which receives the light emitted from the light source and allows collimated light emitted from the light source to pass, and an angle θ between the lateral surface and an optical axis of the optical element is configured for totally internally reflecting at least a part of the light emitted from the light source by the lateral surface;

a structured light diffractive component configured for converting the light emitted from the optical element into a structured light pattern, and spaced apart from the optical element; and an energy recycling mechanism disposed on at least a part of the incident surface of the optical element or at least a part of the emergent surface of the optical element.

9. The structured light illumination module as claimed in claim 8, wherein the angle θ ranges from 7 degree to −18 degree.

10. The structured light illumination module as claimed in claim 8, wherein the part of the light emitted from the light source with a divergence angle being greater than 0 degree and less than or equivalent with 9 degree is reflected back multiple times by the lateral surface inside the optical element for homogenizing the light emitted from the light source.

11. The structured light illumination module as claimed in claim 8, wherein the optical element is made from plastic material with a refractive index of about 1.5.

12. The structured light illumination module as claimed in claim 8, further comprising a lens assembly disposed between the optical element and the diffractive component, and configured to adjust the light passing through the light transmissive zone of the optical element for the diffractive component.

13. The structured light illumination module as claimed in claim 8, wherein an area of the energy recycling mechanism ranges from 0% to 90% of an area of the incident surface of the optical element.

* * * * *